United States Patent
Adl-Tabatabai et al.

(10) Patent No.: US 7,162,583 B2
(45) Date of Patent: Jan. 9, 2007

(54) MECHANISM TO STORE REORDERED DATA WITH COMPRESSION

(75) Inventors: Ali-Reza Adl-Tabatabai, Santa Clara, CA (US); Anwar M. Ghuloum, Mountain View, CA (US); Guei-Yuan Lueh, San Jose, CA (US); Victor Ying, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 481 days.

(21) Appl. No.: 10/747,470

(22) Filed: Dec. 29, 2003

(65) Prior Publication Data

US 2005/0144386 A1 Jun. 30, 2005

(51) Int. Cl.
*G06F 12/00* (2006.01)

(52) U.S. Cl. ............... 711/118; 711/100; 711/133; 711/154; 711/165; 711/170

(58) Field of Classification Search ............ 711/118, 711/100, 133, 154, 165, 170
See application file for complete search history.

(56) References Cited

U.S. PATENT DOCUMENTS

| | | | |
|---|---|---|---|
| 5,389,922 A | | 2/1995 | Seroussi et al. |
| 6,075,470 A | * | 6/2000 | Little et al. ............ 341/107 |
| 6,678,805 B1 | * | 1/2004 | Corduneanu et al. ....... 711/154 |
| 2001/0001872 A1 | | 5/2001 | Singh et al. |
| 2003/0131184 A1 | | 7/2003 | Kever |
| 2003/0135694 A1 | * | 7/2003 | Naffziger et al. .......... 711/118 |
| 2004/0246152 A1 | * | 12/2004 | Castelli et al. .............. 341/87 |
| 2004/0250009 A1 | * | 12/2004 | Chen et al. ................. 711/103 |
| 2004/0250011 A1 | * | 12/2004 | Chen et al. ................. 711/103 |
| 2005/0071579 A1 | * | 3/2005 | Luick ........................ 711/154 |
| 2005/0114600 A1 | * | 5/2005 | Citron ....................... 711/118 |
| 2005/0114601 A1 | * | 5/2005 | Ramakrishnan ............ 711/118 |

OTHER PUBLICATIONS

Ahn et al., "Effective Algorithms for Cache-Level Compression", XP-002318792, pp. 39-92.
Hayahsi, et al., "A New Source Coding Method Based on LZW Adoptind the Least Recently Used Deletion Heuristic", IEEE, pp. 190-193.
PCT Search Report, PCT/US2004/043233, mailed Mar. 21, 2005.

* cited by examiner

*Primary Examiner*—Stephen C. Elmore
(74) *Attorney, Agent, or Firm*—Blakely, Sokoloff, Taylor & Zafman LLP

(57) ABSTRACT

According to one embodiment a computer system is disclosed. The computer system includes a central processing unit (CPU), a cache memory coupled to the CPU and a cache controller, coupled to the cache memory. The cache memory includes a plurality of compressible cache lines to store additional data. The cache controller reorders a cache line after each access to the cache line prior to the compression of the cache line into a compressed cache line.

38 Claims, 11 Drawing Sheets

MECHANISM TO STORE REORDERED DATA WITH COMPRESSION

FIELD OF THE INVENTION

The present invention relates to computer systems; more particularly, the present invention relates to central processing unit (CPU) caches.

BACKGROUND

Currently, various methods are employed to compress the content of computer system main memories such as Random Access Memory (RAM). These methods decrease the amount of physical memory space needed to provide the same performance. For instance, if a memory is compressed using a 2:1 ratio, the memory may store twice the amount of data at the same cost, or the same amount of data at half the cost.

One such method is Memory Expansion Technology (MXT), developed by International Business Machines (IBM) of Armonk, N.Y. MXT addresses system memory costs with a memory system architecture that doubles the effective capacity of the installed main memory. Logic-intensive compressor and decompressor hardware engines provide the means to simultaneously compress and decompress data as it is moved between the shared cache and the main memory. The compressor encodes data blocks into as compact a result as the algorithm permits.

However, there is currently no method for compressing data that is stored in a cache. Having the capability to compress cache data would result in similar advantages as main memory compression (e.g., decreasing the amount of cache space needed to provide the same performance).

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A mechanism for compressing data in a cache is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
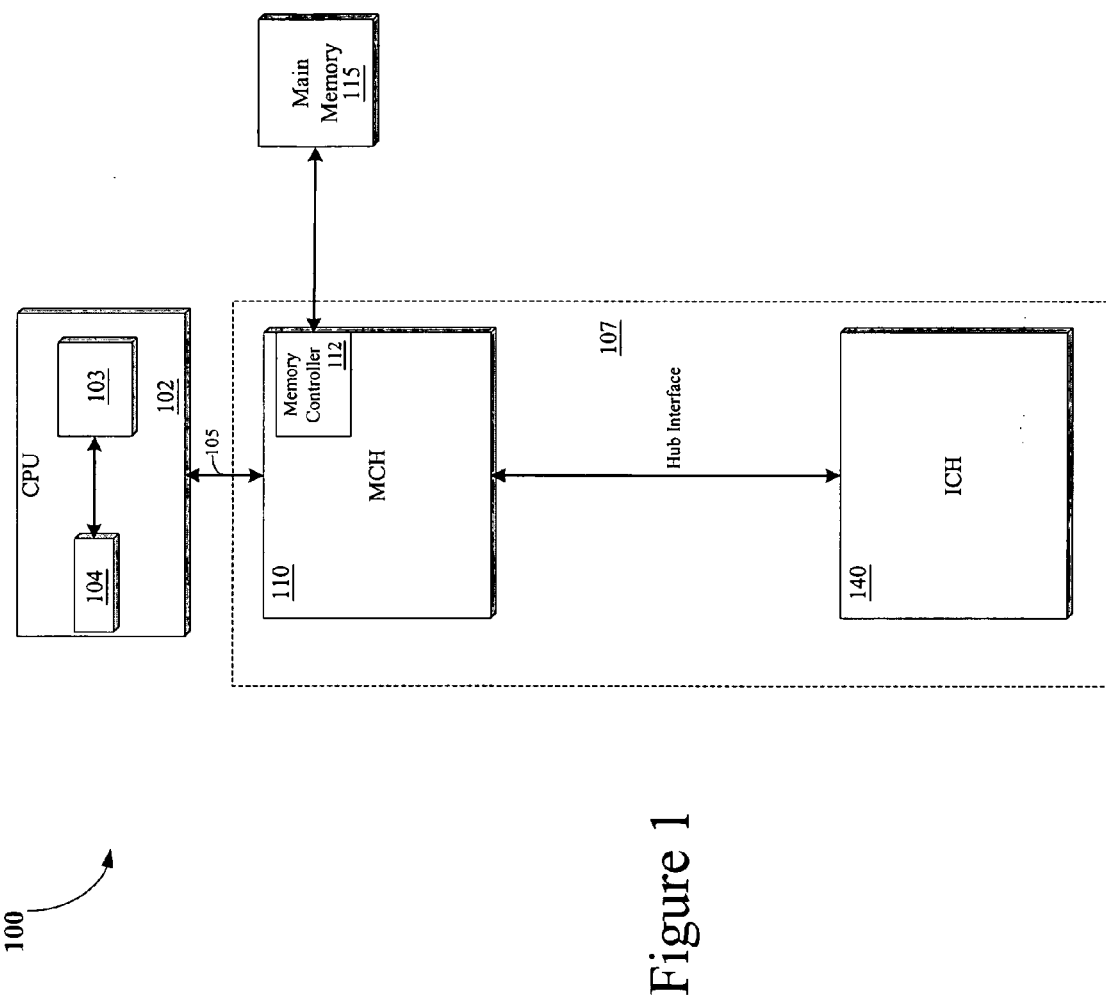
FIG. 1 illustrates one embodiment of a computer system.

FIG. 1 is a block diagram of one embodiment of a computer system 100. Computer system 100 includes a central processing unit (CPU) 102 coupled to bus 105. In one embodiment, CPU 102 is a processor in the Pentium® family of processors including the Pentium® II processor family, Pentium® III processors, and Pentium® IV processors available from Intel Corporation of Santa Clara, Calif. Alternatively, other CPUs may be used.

A chipset 107 is also coupled to bus 105. Chipset 107 includes a memory control hub (MCH) 110. MCH 110 may include a memory controller 112 that is coupled to a main system memory 115. Main system memory 115 stores data and sequences of instructions and code represented by data signals that may be executed by CPU 102 or any other device included in system 100.

In one embodiment, main system memory 115 includes dynamic random access memory (DRAM); however, main system memory 115 may be implemented using other memory types. Additional devices may also be coupled to bus 105, such as multiple CPUs and/or multiple system memories.

In one embodiment, MCH 110 is coupled to an input/output control hub (ICH) 140 via a hub interface. ICH 140 provides an interface to input/output (I/O) devices within computer system 100. For instance, ICH 140 may be coupled to a Peripheral Component Interconnect bus adhering to a Specification Revision 2.1 bus developed by the PCI Special Interest Group of Portland, Oreg.

Compressed Cache

According to one embodiment, a cache memory 103 resides within processor 102 and stores data signals that are also stored in memory 115. Cache 103 speeds up memory accesses by processor 103 by taking advantage of its locality of access. In another embodiment, cache 103 resides external to processor 103.

Figure 2:
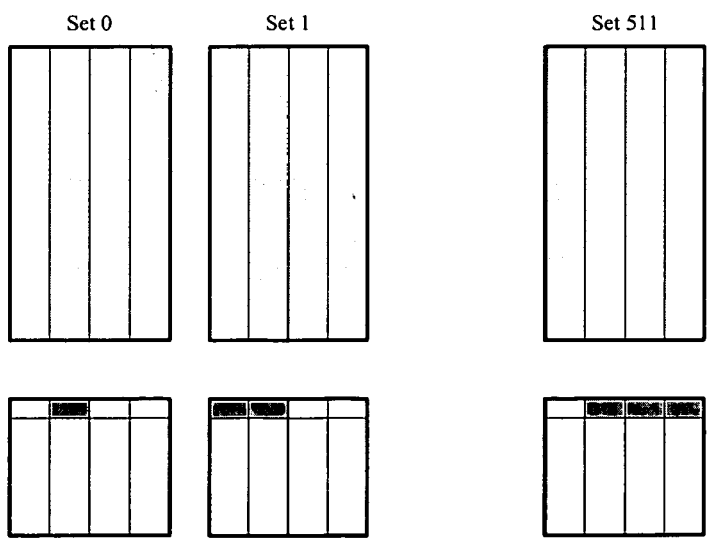
FIG. 2 illustrates one embodiment of a physical cache organization.

According to a further embodiment, cache 103 includes compressed cache lines to enable the storage of additional data within the same amount of area. FIG. 2 illustrates one embodiment of a physical organization for cache 103. In one embodiment, cache 103 is a 512 set, 4-way set associative cache. However, one of ordinary skill in the art will appreciate that caches implementing other sizes may be implemented without departing from the true scope of the invention.

A tag is associated with each line of a set. Moreover, a compression bit is associated with each tag. The compression bits indicate whether a respective cache line holds compressed data. When a compression bit is set, the physical memory of the cache line holds two compressed companion lines. Companion lines are two lines with addresses that differ only in the companion bit (e.g., two consecutive memory lines aligned at line alignment).

In one embodiment, the companion bit is selected so that companion lines are adjacent lines. However, any bit can be selected to be the companion bit. In other embodiments, it may be possible to encode the compression indication with other bits that encode cache line state, such as the MESI state bits, thus eliminating this space overhead altogether.

Figure 3:
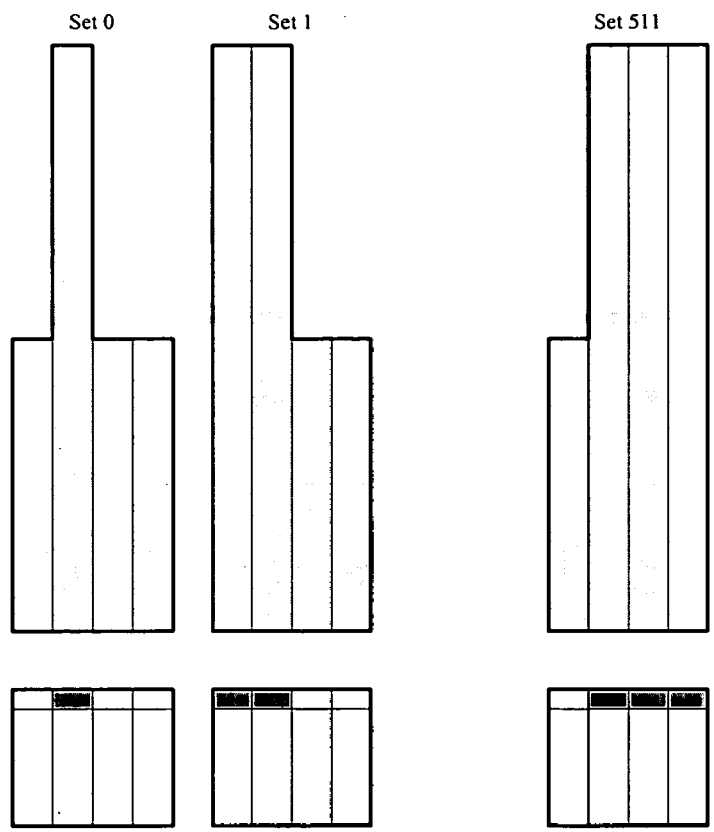
FIG. 3 illustrates one embodiment of a logical cache organization.

When the compression bit is not set, the physical memory of the cache line holds one line uncompressed. Shaded compression bits in FIG. 2 illustrate compressed cache lines. FIG. 3 illustrates one embodiment of a logical organization for cache 103. As shown in FIG. 3, cache lines are compressed according to a 2:1 compression scheme. For example, the second line of set 0 is compressed, thus storing two cache lines rather than one.

In one embodiment, each cache line holds 64 bytes of data when not compressed. Thus, each cache line holds 128 bytes of data when compressed. The effect of the described compression scheme is that each cache tag maps to a variable-length logical cache line. As a result, cache 103 may store twice the amount of data without having to increase in physical size.

Referring back to FIG. 1, a cache controller 104 is coupled to cache 103 to manage the operation of cache 103. Particularly, cache controller 104 performs lookup operations of cache 103. According to one embodiment, the hashing function that is used to map addresses to physical sets and ways is modified from that used in typical cache controllers. In one embodiment, the hashing function is organized so that companion lines map to the same set. Consequently, companion lines may be compressed together into a single line (e.g., way) that uses one address tag.

Figure 4A:
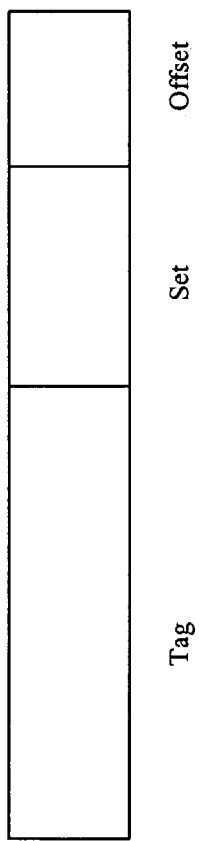
FIG. 4A illustrates an exemplary memory address implemented in an uncompressed cache.

FIG. 4A illustrates an exemplary memory address implemented in an uncompressed cache. In a traditional cache, an addressed is divided according to tag, set and offset components. The set component is used to select one of the sets of lines. Similarly, the offset component is the low order bits of the address that are used to select bytes within a line.

Figure 4B:
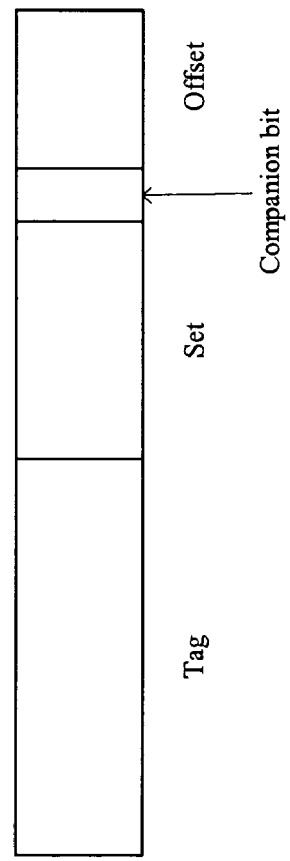
FIG. 4B illustrates one embodiment of a memory address implemented in a compressed cache.

FIG. 4B illustrates one embodiment of a memory address implemented for lookup in a compressed cache. FIG. 4B shows the implementation of a companion bit used to map companion lines into the same set. The companion bit is used in instances where a line is not compressed. Accordingly, if a line is not compressed, the companion bit indicates which of the two compressed companion lines are to be used.

In one embodiment, the window of address bits that are used for set selection is shifted to the left by one so that the companion bit lies between the set selection and byte offset bits. In this way, companion lines map to the same cache set since the companion bit and set selection bits do not overlap. The companion bit, which now is no longer part of the set selection bits, becomes part of the tag, though the actual tag size does not increase. In a traditional uncompressed cache, the companion bit is a part of the address and is used in set selection to determine whether an address hashes to an odd or even cache set.

Figure 5:
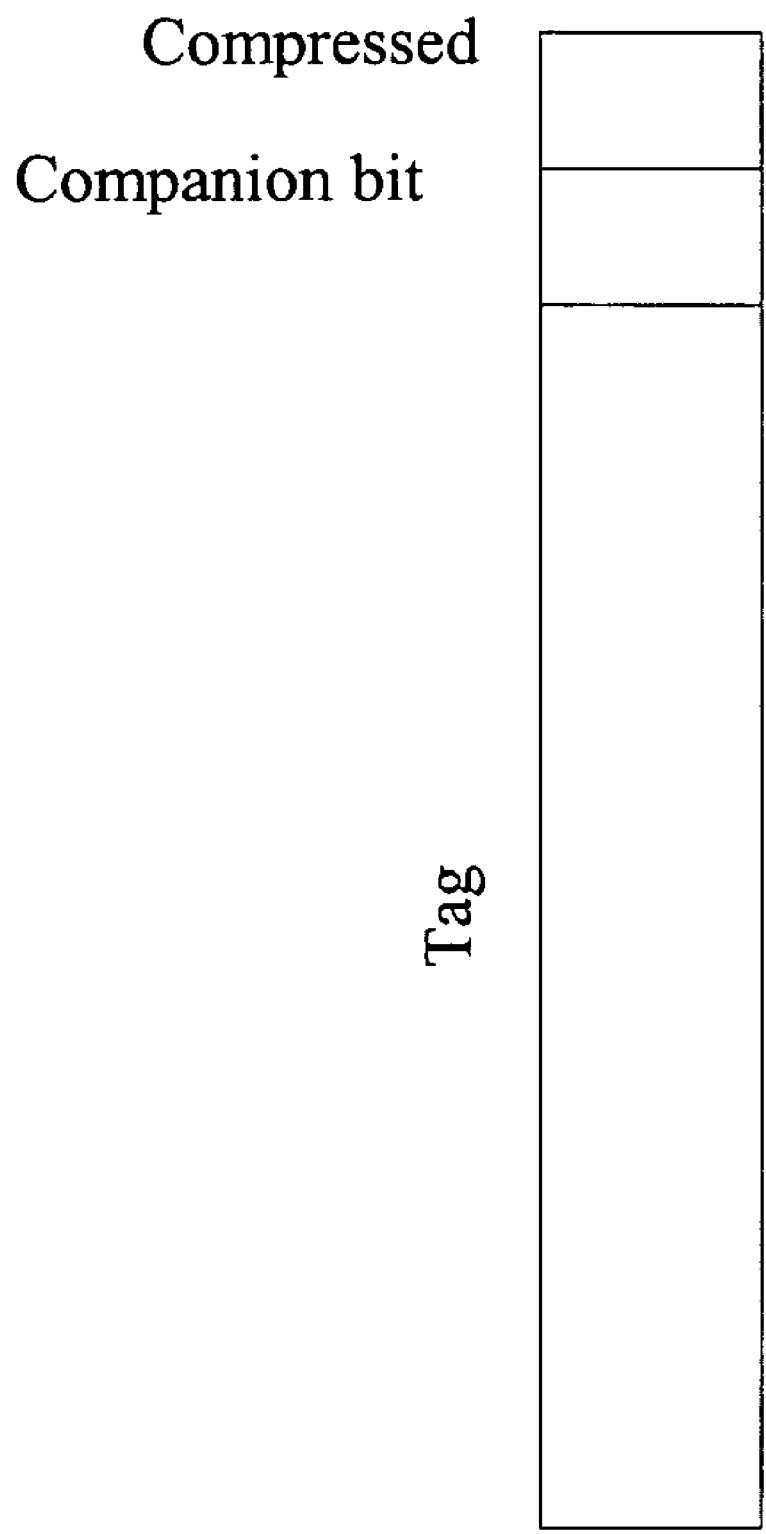
FIG. 5 illustrates one embodiment of a tag array entry for a compressed cache.

FIG. 5 illustrates one embodiment of a tag array entry for a compressed cache. The tag array entries include the companion bit (e.g., as part of the address tag bits) and a compression bit. The compression bit causes the compressed cache 103 tag to be one bit larger than a traditional uncompressed cache's tag. The compression bit indicates whether a line is compressed.

Particularly, the compression bit specifies how to deal with the companion bit. If the compression bit indicates a line is compressed, the companion bit is treated as a part of the offset because the line is a compressed pair. If the compression bit indicates no compression, the companion bit is considered as a part of the tag array and ignored as a part of the offset.

Figure 6:
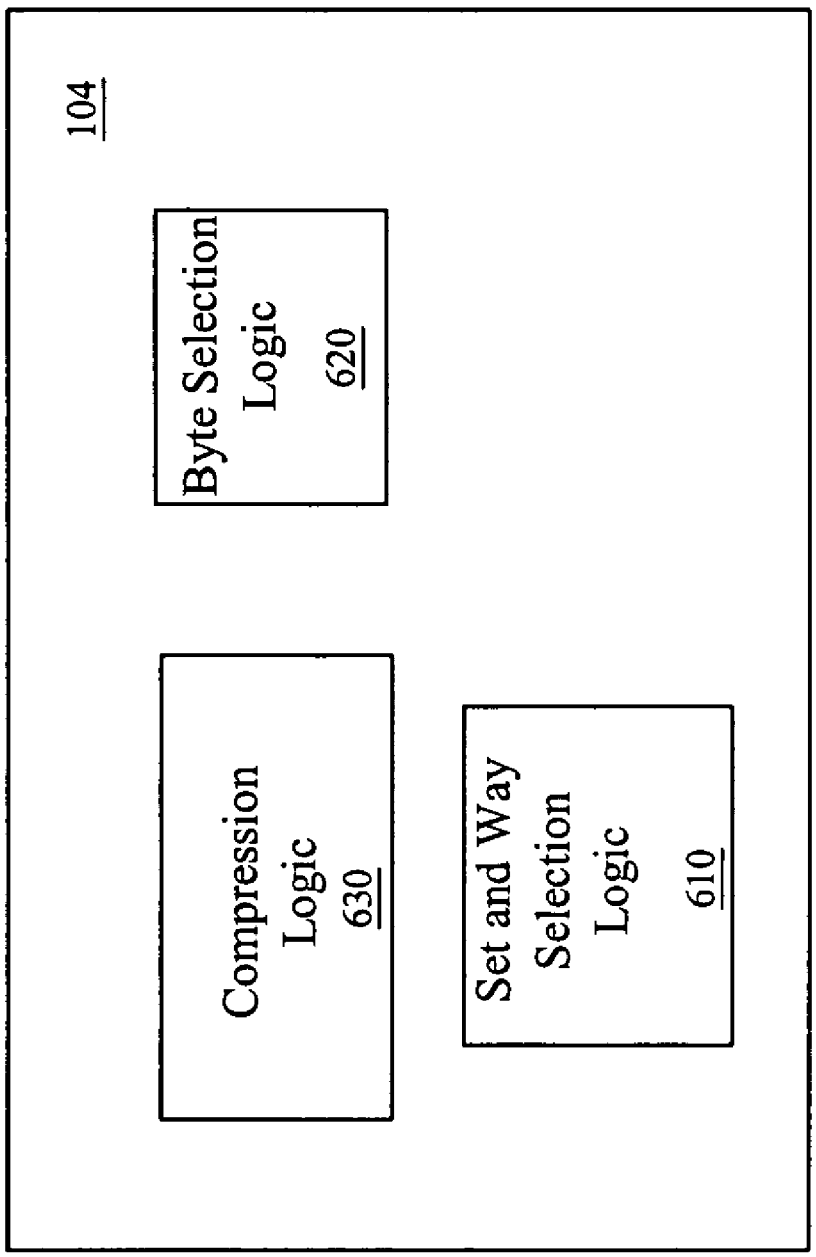
FIG. 6 is a block diagram illustrating one embodiment of a cache controller.
Figure 7:
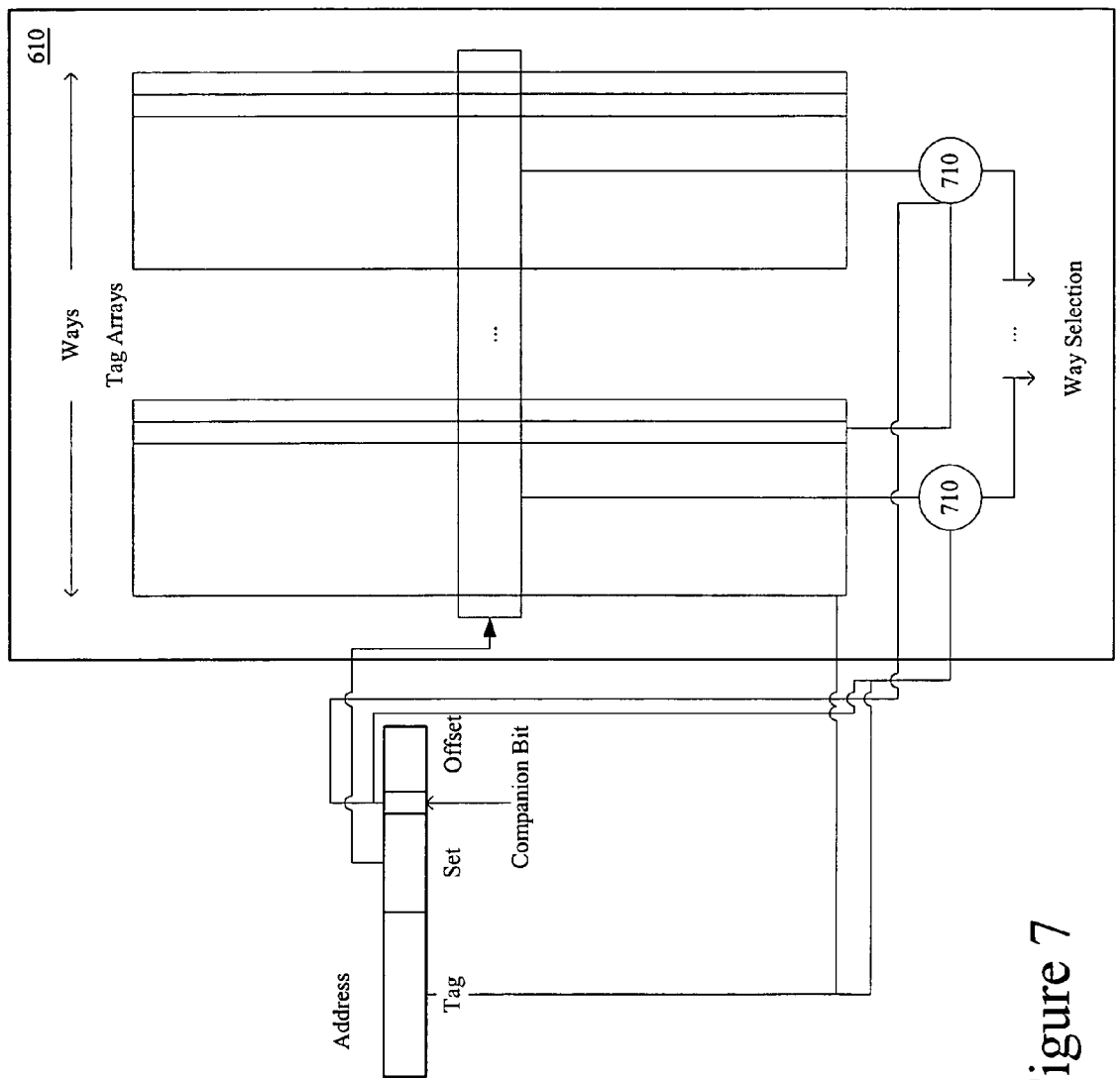
FIG. 7 illustrates one embodiment of a set and way selection mechanism in a compressed cache.

FIG. 6 is a block diagram illustrating one embodiment of cache controller 104. Cache controller 104 includes set and way selection logic 610, byte selection logic 620 and compression logic 630. Set and way selection logic 610 is used to select cache lines within cache 103. FIG. 7 illustrates one embodiment of set and way selection logic 610 in a compressed cache.

Referring to FIG. 7, set and way selection logic 610 includes tag comparison logic 710 that receives input from a tag array to select a cache line based upon a received address. The tag comparison logic 710 takes into account whether a cache line holds compressed data. Because cache lines hold a variable data size, tag comparison logic 710 is also variable length, depending on whether a particular line is compressed or not. Therefore, the tag match takes into account the compression bit.

Figure 8:
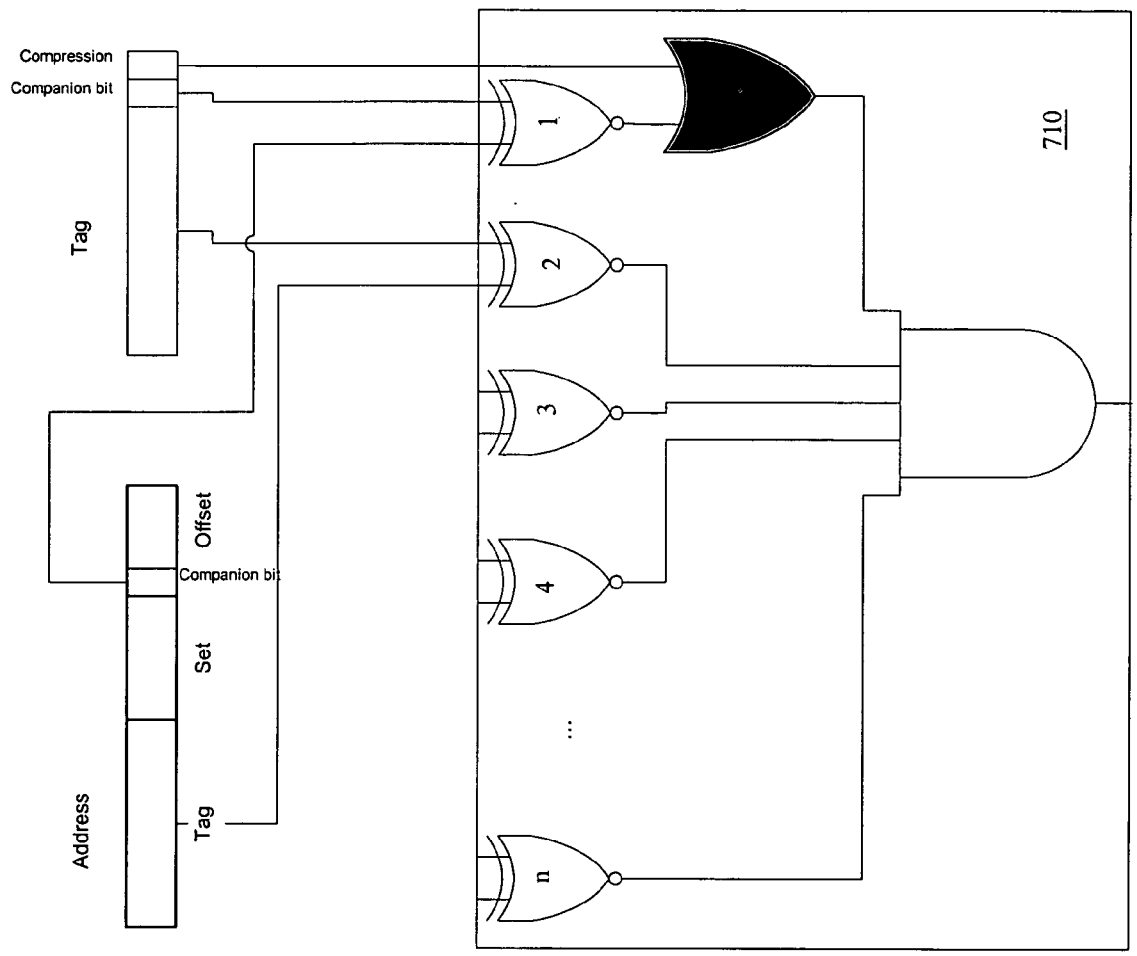
FIG. 8 illustrates one embodiment of tag comparison logic.

FIG. 8 illustrates one embodiment of tag comparison logic 710 includes exclusive-nor (XNOR) gates 1-n, an OR gate and an AND gate. The XNOR gates and the AND gate is included in traditional uncompressed caches, and are used to compare the address with tag entries in the tag array until a match is found. The OR gate is used to select the companion bit depending upon the compression state of a line.

The companion bit of the address is selectively ignored depending on whether the compression bit is set. As discussed above, if the compression bit is set, the companion bit of the address is ignored during tag match because the cache line contains both companions. If the compression bit is not set, the companion bit of the address is compared with the companion bit of the tag.

The "Product of XNOR" organization of the equality operator, therefore, uses the OR gate to selectively ignore the companion bit. In one embodiment, because the tag's companion bit is ignored when the compression bit is set (e.g., it is a "don't care"), the tag's companion bit can be used for other uses. For example, when a line is compressed, this bit may be used as a compression format bit to select between two different compression algorithms. In another example, the companion bit can be used to encode the ordering of companion lines in the compressed line.

Figure 9:
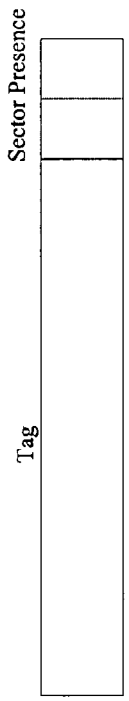
FIG. 9 illustrates another embodiment of a tag array entry for a compressed cache.

In other embodiments, each cache line is partitioned into two sectors that are stored in the same physical cache line only if the sectors can be compressed together. In the tag entry, the companion and compression bits become sector presence indications, as illustrated in FIG. 9. In this embodiment, the companion bit is a sector identifier (e.g., upper or lower) and thus has been relabeled as sector ID.

Accordingly, a "01" indicates a lower sector (not compressed), "10" indicates an upper sector (not compressed), and a "11" indicates both sectors (2:1 compression). Also, in this arrangement the physical cache line size is the same as the logical sector size. When uncompressed, each sector of a line is stored in a different physical line within the same set (e.g., different ways of the same set).

When compressible by at least 2:1, the two sectors of each line are stored in a single physical cache line (e.g., in one way). It is important to note that this differs from traditional sectored cache designs in that different logical sectors of a given logical line may be stored simultaneously in different ways when uncompressed.

Figure 10:
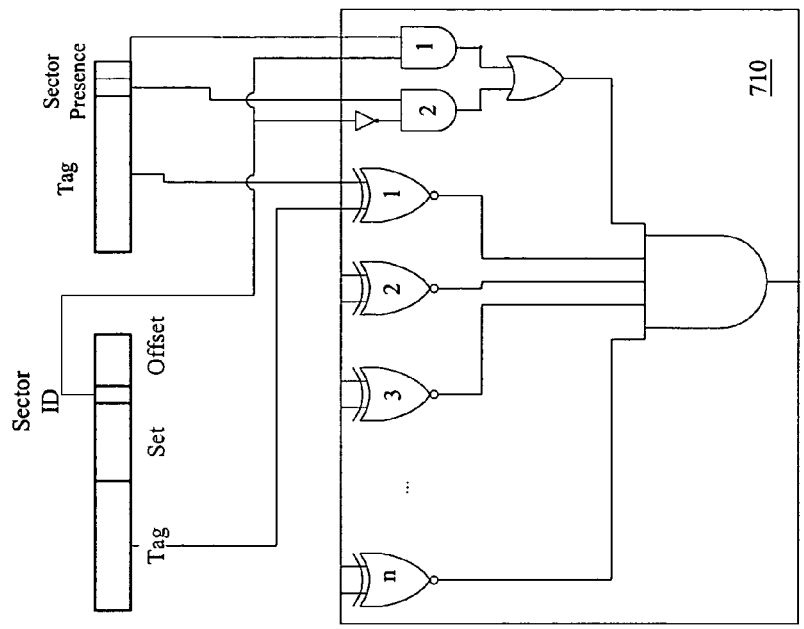
FIG. 10 illustrates another embodiment of tag comparison logic.

In one embodiment, a free encoding ("00") is used to indicate an invalid entry, potentially reducing the tag bit cost if combined with other bits that encode the MESI state. Because this is simply an alternative encoding, the sector presence bits require slightly difference logic to detect tag match. FIG. 10 illustrates another embodiment of tag comparison logic 610 implementing sector presence encoding.

Figure 11:
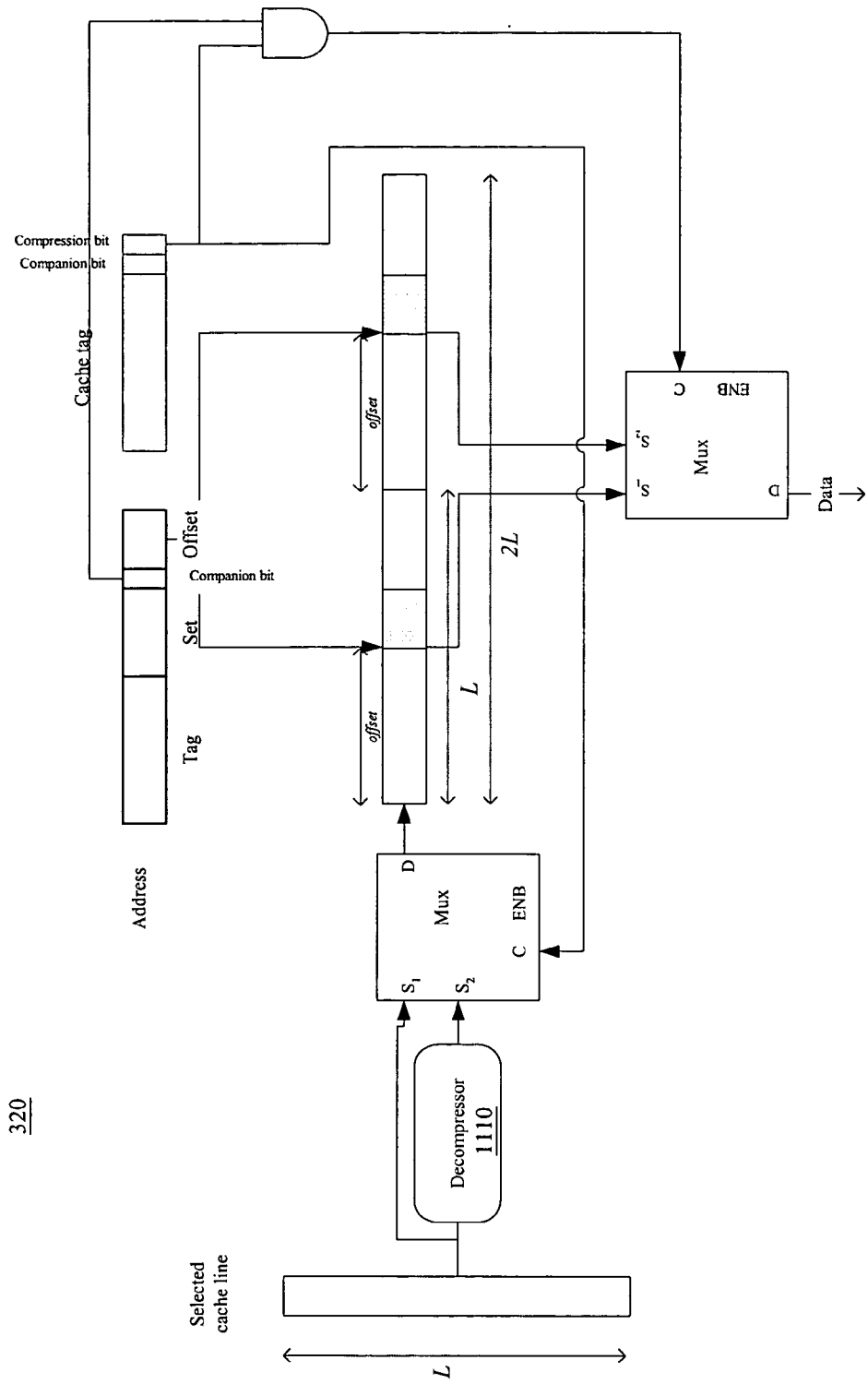
FIG. 11 illustrates one embodiment of byte selection logic.

Referring back to FIG. 6, byte selection logic 620 selects the addressed datum within a line. According to one embodiment, byte selection logic 620 depends on the compression bit. FIG. 11 illustrates one embodiment of byte selection logic 620. Byte selection logic 620 includes a decompressor 1110 to decompress a selected cache line if necessary. An input multiplexer selects between a decompressed cache line and an uncompressed cache line depending upon the compression bit.

In one embodiment, the range of the offset depends on whether the line is compressed. If the line is compressed, the companion bit of the address is used as the high order bit of the offset. If the line is not compressed, decompressor 1110 is bypassed and the companion bit of the address is not used for the offset. The selected line is held in a buffer whose size is twice the physical line size to accommodate compressed data.

Alternative embodiments may choose to use the companion bit to select which half of the decompressed word to store in a buffer whose length is the same as the physical line size. However, buffering the entire line is convenient for modifying and recompressing data after writes to the cache.

Referring back to FIG. 6, compression logic 630 is used to compress cache lines. In one embodiment, cache lines are compressed according to a Lempel-Ziv compression algorithm. However in other embodiments, other compression algorithms (e.g., WK, X-Match, sign-bit compression, run-length compression, etc.) may be used to compress cache lines.

Compression logic 630 may also be used to determine when a line is to be compressed. According to one embodiment, opportunistic compression is used to determine when a line is to be compressed.

In opportunistic compression, when a cache miss occurs the demanded cache line is fetched from memory 115 and cache 103 attempts to compress both companions into one line if its companion line is resident in the cache. If the companion line is not resident in cache 103 or if the two companions are not compressible by 2:1, then cache 103 uses its standard replacement algorithm to make space for the fetched line.

Otherwise, cache 103 reuses the resident companion's cache line to store the newly compressed pair of companions thus avoiding a replacement. Note, that it is easy to modify the tag match operator to check whether the companion line is resident without doing a second cache access. For example, if all of the address tag bits except for the companion bit match, then the companion line is resident.

In another embodiment, a prefetch mechanism is used to determine if lines are to be compressed. In the prefetch compression mechanism the opportunistic approach is refined by adding prefetching. If the companion of the demand-fetched line is not resident, the cache prefetches the companion and attempts to compress both companions into one line.

If the two companion lines are not compressible by 2:1, cache 103 has the choice of either discarding the prefetched line (thus wasting bus bandwidth) or storing the uncompressed prefetched line in the cache (thus potentially resulting in a total of two lines to be replaced in the set). In one embodiment, the hardware can adaptively switch between these policies based on how much spatial locality and latency tolerance the program exhibits.

In another embodiment, a victim compression mechanism is used to determine if lines are to be compressed. For victim compression, there is an attempt to compress a line that is about to be evicted (e.g., a victim). If a victim is not already compressed and its companion is resident, cache 103 gives the victim a chance to remain resident in the cache by attempting to compress it with its companion. If the victim is already compressed, its companion is not resident, or the victim and its companion are not compressible by 2:1, the victim is then evicted. Otherwise, cache 103 reuses the resident companion's cache line to store the compressed pair of companions, thus avoiding the eviction.

As data is written, the compressibility of a line may change. A write to a compressed pair of companions may cause the pair to be no longer compressible. Three approaches may be taken if a compressed cache line becomes uncompressible. The first approach is to simply evict another line to make room for the extra line resulting from the expansion. This may cause two companion lines to be evicted if all lines in the set are compressed.

The second approach is to evict the companion of the line that was written. The third approach is to evict the line that was written. The choice of which of these approaches to take depends partly on the interaction between the compressed cache 103 and the next cache closest to the processor (e.g., if the L3 is a compressed cache then it depends on the interaction between L3 and L2).

Assuming that the compressed cache is an inclusive L3 cache and that L2 is a write-back cache, the first two approaches include an invalidation of the evicted line in the L2 cache to maintain multi-level inclusion, which has the risk of evicting a recently accessed cache line in L2 or L1. The third approach does not require L2 invalidation and does not have the risk of evicting a recently accessed cache line from L2 because the line that is being written is being evicted from L2.

The above-described mechanism allows any two cache lines that map to the same set and that differ only in their companion bit to be compressed together into one cache line. In one embodiment, the mechanism modifies the set mapping function and selects the companion bit such that it allows adjacent memory lines to be compressed together, which takes advantage of spatial locality.

Reordering Cache Lines for Compression

The above-described cache compression mechanism is an effective technique for reducing the spatio-temporal resource requirements in a cache. However, whenever serial algorithms are implemented to compress cache line data, an increased latency in accessing cache lines will often be incurred since the lines have to be decompressed prior to access. For example, compression algorithms such as Lempel-Ziv and Wilson-Kaplan preclude random access to compressed data. Thus, data in a compressed cache line can only be accessed serially.

Figure 12:
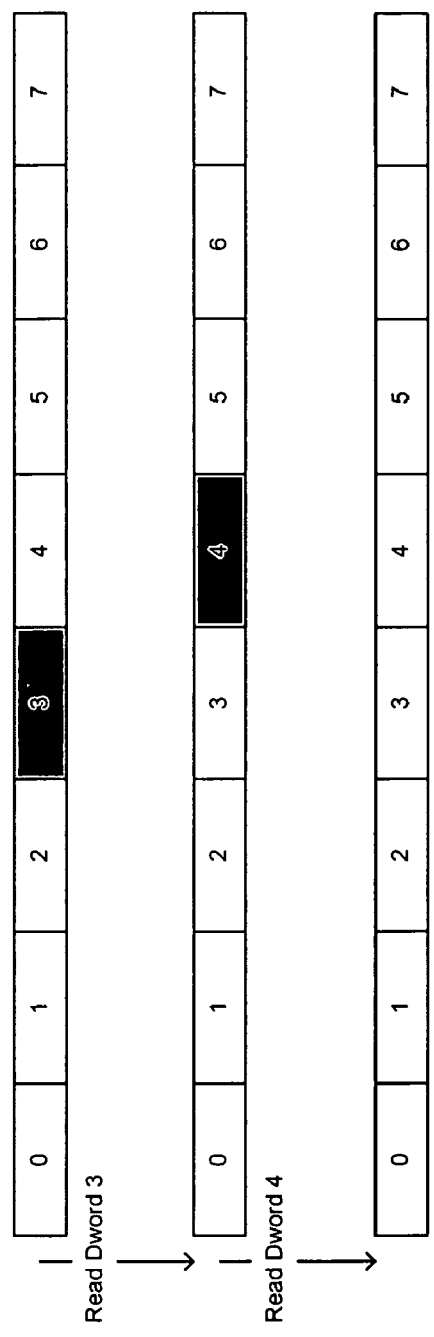
FIG. 12 illustrates one embodiment of an un-rotated cache line.

FIG. 12 illustrates one embodiment of read offsets at a cache line. For a first read access to the cache line, dword (32-bit word) 3 in the cache line is to be accessed. However, prior to accessing the third dword, dwords 0–3 must be decompressed. For a subsequent read access, dword 4 is to be accessed. In this instance, dwords 0–4 must be decompressed prior to accessing dword 4. If a scheme decompresses one dword per clock cycle, the time to access the fourth dword will take 4 cycles. Having to decompress four or more dwords each time a dword is to be accessed is inefficient and results in a waste of processing time.

According to one embodiment, cache lines are re-ordered after each access prior to compression in order to reduce access latency. For instance, the reordering scheme predicts which word will be accessed in the next access to a line (e.g., the critical word), and places this predicted word at the beginning of the block to minimize its access latency.

Although the embodiment described herein will emphasize a cache compression system, one of ordinary skill in the art will appreciate that the described mechanism extends the reordering of words within bus transaction or memory block. Examples of such systems include a large block transfer scheme, which requires multiple bus transactions in block order, and a serialized compression scheme for a memory system in which data is not delivered critical chunk first. In such systems, the time to access the critical word of the access is also approximately proportional to the position of the critical word in the data block.

One of ordinary skill in the art will appreciate that the described mechanism may also be applied to other data transforming systems. One embodiment of such a data transforming system includes gather scatter operations that pack/unpack sparse memory locations into densely packed memory locations, registers or cache lines. In such an embodiment, a large block of data may have only a few words that are actually read. An optimization enables a "gather" operation, which only reads (and packs in a cache line) in the few important words from this large block of data so as to not pollute the cache or waste bandwidth. Some specialized memory systems (for example, host-bus adapters for network-attached storage) make use of this transformation. The process of writing the data back to memory and spreading the data across the large block is referred to as a "scatter" operation.

In one embodiment, the reordering scheme is based on the premise that the next word accessed in each cache line is predictable. There are two driving intuitions here. First, for sequential access, the next word accessed will be the next word immediately adjacent to the last accessed word. Second, for non-sequential access, the particular program-level data structure instance accessed will remain at a fixed offset within the cache line. Consequently, accesses to that data structure instance will likely manifest itself in the same access offset within the cache line.

Figure 13:
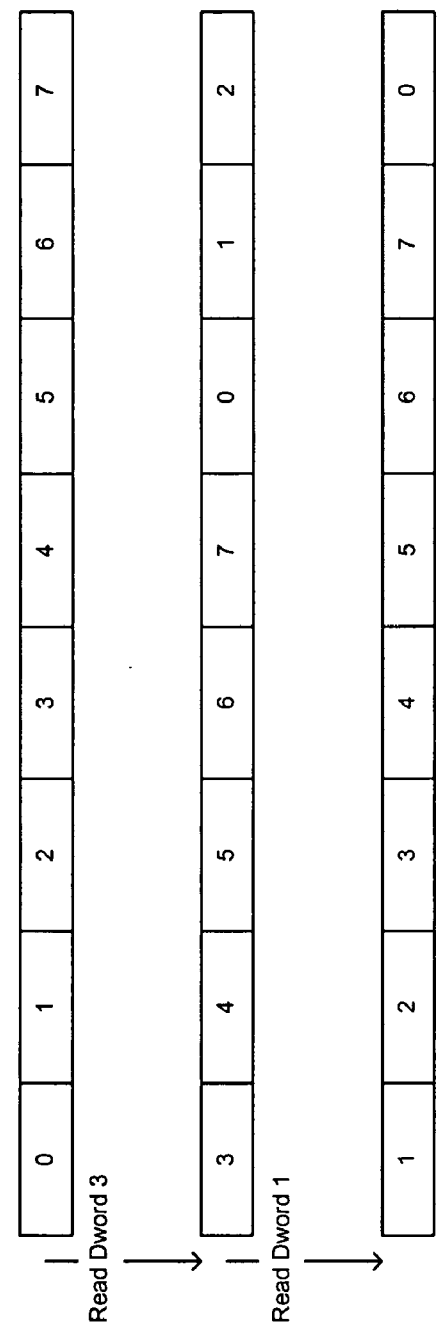
FIG. 13 illustrates one embodiment of a rotated cache line.

The reordering scheme allows various permutations. In one embodiment, a rotation of the cache line to any dword or offset is implemented. In particular, a cache line is rotated upon a read access to the line so that the accessed word or chunk is moved to the front of the line. FIG. 13 illustrates one embodiment of a cache line implementing the rotation scheme. On a read of dword 3, the line rotates to that dword 3 as the first dword. On a subsequent read of dword 1, the line rotates so that dword 1 is the first dword.

Figure 14:
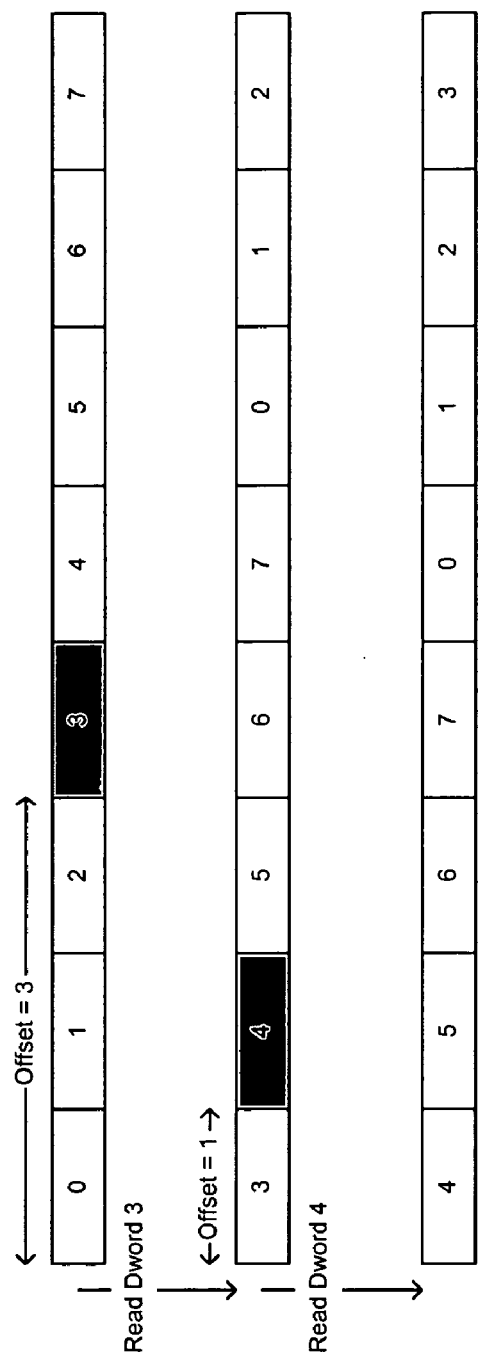
FIG. 14 illustrates another embodiment a rotated cache line.

FIG. 14 illustrates one embodiment of a cache line implementing the rotation scheme. In this embodiment, the processor reads dword 3 followed by dword 4 in a line. With rotation, the second access to dword 4 has an offset 1 of the line. As a result, a savings of 3 cycles is realized by the rotation scheme.

In one embodiment, the permutation in the rotation scheme is recorded as an offset into the line. Thus, for dword-wise rotation in a 64-byte line 4 bits per line are implemented for the offset. In other embodiments, a cache line may be rotated by a chunk (e.g., 2 dwords). For chunk-wise rotation, 3 bits per line are implemented for the offset. In a compressed cache, the compressed lines are rotated, with the permutation scheme being encoded using bits in the compressed line.

In one embodiment, rotation occurs as the line is compressed (e.g., the line is compressed in the critical-chunk-first order in which it arrives from memory, which also allows overlapping compression with memory transfer). The advantage of this scheme is that no additional tables are required to store permutation data.

An alternative scheme is to include an array of permutation indices alongside the tag arrays to record the permutation. The advantage of this scheme is that it does not require compression for reordering. For bus or interconnect transactions, the transmitting agent specifies the ordering in the communicated block. In other embodiments, rotation may occur for write transactions or first reads into the cache.

Another reordering permutation includes moving the last accessed dword to the front, while maintaining line ordering for the rest of the line. In another embodiment, the cache line is rotated so that the last dword accessed is placed at the second dword in the line. In yet another embodiment, involves compressed pairs of lines where the last accessed line is moved to the front of the compressed pair. In other embodiments, a cache line may feature a permutation based upon a most recently used dword order.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A computer system comprising:
a central processing unit (CPU);
a cache memory, coupled to the CPU, having a plurality of compressible cache lines to store additional data; and
a cache controller, coupled to the cache memory, to reorder a cache line after each access to the cache line prior to the compression of the cache line into a compressed cache line.

2. The computer system of claim 1 wherein the cache controller performs a reordering scheme to predict a word in the cache line that will next be accessed and places the predicted word at the beginning of the cache line.

3. The computer system of claim 2 wherein the predicted word in the cache line has an associated offset.

4. The computer system of claim 2 wherein the reordering scheme comprises rotating the cache line so that the accessed word is moved to the front of the cache line.

5. The computer system of claim 4 wherein the cache line is rotated upon being compressed.

6. The computer system of claim 4 wherein an array of indices are stored to record the rotation permutation of the cache line.

7. The computer system of claim 2 wherein the reordering scheme comprises moving the last accessed word of the cache line to the front of the cache line while maintaining line ordering for the remainder of the cache line.

8. The computer system of claim 2 wherein the reordering scheme comprises rotating the cache line so that the last word accessed is located at the second word in the cache line.

9. The computer system of claim 2 wherein the reordering scheme is based upon a most recently used word order in the cache line.

10. The computer system of claim 2 further comprising a memory controller coupled to the CPU, the memory controller comprising:
    compression logic to compress one or more lines of data into compressed lines of data;
    decompression logic to decompress the compressed lines of data; and
    logic to reorder a line of data after each access to the line prior to the compression of the line of data into a compressed line of data.

11. The computer system of claim 10 further comprising:
    a bus, coupled to the memory controller, to transmit and receive the compressed lines of data; and
    a main memory coupled to the bus.

12. The computer system of claim 1 wherein the cache controller comprises:
    compression logic to compress one or more lines of data into compressed lines of data; and
    decompression logic to decompress the compressed lines of data.

13. A method comprising:
    accessing a first line of data;
    predicting a first word in the line of data that will next be accessed;
    placing the first word at the beginning of the line of data; and
    compressing the first line of data to form a compressed data line.

14. The method of claim 13 further comprising storing an offset to the line of data indicating where the first word is placed in the line of data.

15. The method of claim 13 wherein placing the first word at the beginning of the line of data comprises rotating the line of data so that the first word is at the beginning of the line of data.

16. The method of claim 15 further comprising storing an array of indices to record the rotation permutation of the line of data.

17. The method of claim 13 wherein placing the first word at the beginning of the line of data comprises rotating the line of data so that a last accessed word of the line of data is at the front of the line of data while maintaining line ordering for the remainder of the cache line.

18. The method of claim 13 wherein placing the first word at the beginning of the line of data comprises rotating the cache line so that the last word accessed is located at the second word in the cache line.

19. An apparatus comprising:
    compression logic to compress one or more lines of data into compressed lines of data; and
    logic to reorder a line of data after each access to the line prior to the compression of the line of data into a compressed line of data.

20. The apparatus of claim 19 further comprising decompression logic to decompress the compressed lines of data.

21. The apparatus of claim 19 wherein the logic to reorder a line of data performs a reordering scheme to predict a word in the line of data that will next be accessed and places the predicted word at the beginning of the line of data.

22. The apparatus of claim 21 wherein the predicted word in the line of data has an associated offset.

23. The apparatus of claim 21 wherein the reordering scheme comprises rotating the line of data so that the accessed word is moved to the front of the line of data.

24. The apparatus of claim 23 wherein the cache line is rotated upon being compressed.

25. A computer system comprising:
    a central processing unit (CPU);
    a memory controller, coupled to the CPU, including:
        compression logic to compress one or more of the plurality of cache lines into compressed cache lines; and
        logic to reorder a line of data after each access to the line prior to the compression of the line of data into a compressed line of data; and
    a main memory coupled to the memory controller.

26. The computer system of claim 25 wherein the memory controller further comprises decompression logic to decompress the compressed cache lines.

27. The computer system of claim 25 wherein the memory controller performs a reordering scheme to predict a word in the line of data that will next be accessed and places the predicted word at the beginning of the line of data.

28. The computer system of claim 27 wherein the predicted word in the line of data has an associated offset.

29. A computer system comprising a control hub/switch having:
    compression logic to compress one or more lines of data into compressed lines of data; and
    logic to reorder a line of data after each access to the line prior to the compression of the line of data into a compressed line of data.

30. The computer system of claim 29 wherein the control hub/switch further comprises decompression logic to decompress the compressed cache lines.

31. The computer system of claim 30 wherein the hint logic extracts hint information from the compressed lines of data.

32. A computer system comprising a bus controller having:
    compression logic to compress one or more lines of data into compressed lines of data; and
    logic to reorder a line of data after each access to the line prior to the compression of the line of data into a compressed line of data.

33. The computer system of claim 32 wherein the bus controller further comprises decompression logic to decompress the compressed cache lines.

34. The computer system of claim 33 wherein the hint logic extracts hint information from the compressed lines of data.

35. An apparatus comprising:
    data transformation logic to transform one or more blocks of data into compressed blocks of data; and
    logic to reorder a block of data after each access to the block prior to the compression of the block of data into a compressed block of data, wherein the logic to reorder a block of data performs a reordering scheme to predict a word in the block of data that will next be accessed and places the predicted word at the beginning of the block.

36. The apparatus of claim 35 further comprising decompression logic to decompress the compressed block of data.

37. The apparatus of claim 35 wherein the predicted word in the block has an associated offset.

38. The apparatus of claim 35 wherein the data transformation logic performs gather/scatter operations.

* * * * *